United States Patent
Kootstra

(10) Patent No.: US 6,990,610 B2
(45) Date of Patent: Jan. 24, 2006

(54) COMBINING COMMANDS TO FORM A TEST COMMAND

(75) Inventor: Lewis Stephen Kootstra, Roseville, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 504 days.

(21) Appl. No.: 10/146,344

(22) Filed: May 15, 2002

(65) Prior Publication Data
US 2004/0078675 A1   Apr. 22, 2004

(51) Int. Cl.
G06F 11/00 (2006.01)
(52) U.S. Cl. .......................................... 714/32; 714/35
(58) Field of Classification Search ................ 714/32, 714/35; 712/24, 227
See application file for complete search history.

(56) References Cited

U.S. PATENT DOCUMENTS

| | | | |
|---|---|---|---|
| 3,576,541 A * | 4/1971 | Kwan et al. .................. 714/32 |
| 4,439,828 A * | 3/1984 | Martin ........................ 712/226 |
| 4,602,210 A | 7/1986 | Fasang et al. | |
| 5,634,118 A * | 5/1997 | Blomgren .................... 712/226 |
| 5,719,881 A * | 2/1998 | Yonetoku ..................... 714/25 |
| 5,732,209 A | 3/1998 | Vigil et al. | |
| 5,883,906 A * | 3/1999 | Turnquist et al. ........... 714/738 |
| 5,960,009 A | 9/1999 | Gizopoulos et al. | |
| 6,026,485 A * | 2/2000 | O'Connor et al. .......... 712/226 |
| 6,058,468 A | 5/2000 | Funyu | |
| 6,282,527 B1 * | 8/2001 | Gounares et al. ............. 706/13 |
| 6,349,383 B1 * | 2/2002 | Col et al. ................... 712/226 |
| 6,658,551 B1 * | 12/2003 | Berenbaum et al. .......... 712/24 |
| 6,678,739 B1 * | 1/2004 | Muraoka ..................... 709/247 |
| 2003/0177338 A1 * | 9/2003 | Luick .......................... 712/209 |

* cited by examiner

Primary Examiner—Robert Beausoliel
Assistant Examiner—Gabriel L. Chu

(57) ABSTRACT

A device testing method and interface includes receiving a first command and a second command, selectively combining at least a portion of the second command with at least a portion of the first command to generate a test command, and transmitting the test command to the device. In one embodiment, combining the first and second commands reduces the number of test cycles required to test the device.

17 Claims, 5 Drawing Sheets

| Command | Chip Access? | Description/Action |
|---|---|---|
| Write | True | Writes a register inside the chip. |
| Clock | True | Writes a specific register inside the chip which results in the generation of a string of clocks. |
| Read | True | Reads a register inside the chip. |
| Assert | True | Reads a register inside the chip and checks that is the specified value. |
| Delay | False | Kills some time. |
| Output | False | Formats a comment or result so the generated verilog file can output it. |
| Clock Burst | False | Trigger for the tester to burst its clock. |

Fig. 1

| Input Commands | Test Commands Without Combination | Test Commands With Combination |
|---|---|---|
| write (release_from_reset); assert_that (we_are_operating); write (clock_100_times); | test_cmd (release_write_data, release_write_address, null_read_address); test_cmd (null_write_data, null_write_address, operating_read_address); test_cmd (clock_100_write_data, clock_write_address, null_read_address); | test_cmd (release_write_data, release_write_address, operating_read_address); test_cmd (clock_100_write_data, clock_write_address, init_fin_read_address); |
|  | <check_results (operate_flag_true?);> | <check_results (operate_flag_true?);> |
| assert_that (init_is_finished); write (clock_some_more); | test_cmd (null_write_data, null_write_address, init_fin_read_address); test_cmd (clock_more_write_data, clock_write_address, null_read_address); | test_cmd (clock_more_write_data, clock_write_address, not_halted_read_address); |
|  | <check_results (init_finished?);> | <check_results (init_finished?);> |
| assert_that (not_in_halt_state); | test_cmd (null_write_data, null_write_address, not_halted_read_address); test_cmd (null_write_data, null_write_address, null_read_address); | test_cmd (null_write_data, null_write_address, null_read_address); |
|  | <check_results (not_in_halt_state?);> | <check_results (not_in_halt_state?);> |

Fig. 6 ically different from the ones the prior art method requires.

COMBINING COMMANDS TO FORM A TEST COMMAND

TECHNICAL FIELD

The present invention is directed to testing of electronic devices.

BACKGROUND OF THE INVENTION

Testing an electronic device, such as an integrated circuit (IC), for proper operation is an integral part of device manufacturing. Conventional testing processes usually involve coupling a programmatic interface to test at a serial port of the device, inputting serial bit test streams into the device via the interface and monitoring a serial bit stream output from the device in response to the serial bit test stream. In some processes, the testing involves transmitting a write command that writes commands to the device followed by one or more read commands to verify the device's functionality.

Because the responses to the serial bit test stream are themselves a serial bit stream, matching the response data from the device (e.g., data responsive to the read command) with its corresponding test input (e.g., the write command) is often difficult and confusing; in many cases, the data output from the device does not correspond to the most recent test input and is instead a response to a previous test input. Attempts to circumvent this problem include preparing dummy test commands to simplify test program flow. For example, programmers may initiate a test command, place the test command results onto a stack, then initiate a subsequent command, such as a "check results" command, to return to the stack to do the actual comparison and read the test command results. Although adding dummy test commands does simplify tracking of the test commands and their corresponding results, any operation using this method requires at least two commands, increasing the number of test cycles for a given operation. The extra test vectors undesirably require extra testing cycles, and therefore extra time, to execute.

There is a desire for a device testing method that can maintain clear instruction flow without unduly increasing the number of test cycles.

SUMMARY OF THE INVENTION

Accordingly, one embodiment of the invention is directed to a device testing method, comprising receiving a first command and a second command, selectively combining at least a portion of the second command with at least a portion of the first command to generate a test command, and transmitting the test command to the device.

Another embodiment of the invention is directed to a device testing method, comprising receiving a previous command and a current command, determining whether the current command is of a predetermined type, combining at least a portion of the current command with at least a portion of the previous command if the current command is of the predetermined type to form a combined command, and transmitting the combined command as a test command to the device.

A further embodiment of the invention is directed to a device testing interface, comprising a pending buffer, a data record area and a processor that receives a plurality of input commands, including a previous command and a current command, wherein the processor stores a previous command in the pending buffer, determines whether the current command is of a predetermined type, combines at least a portion of the current command with at least a portion of the previous command if the current command is of the predetermined type to form a combined command, and transmits the combined command as a test command to the device.

Other aspects of the invention will be apparent to those skilled in the art after reviewing the drawings and the detailed description below.

BRIEF DESCRIPTION OF THE DRAWINGS

FIG. 1 is a chart describing possible commands used by a test interface according to one embodiment of the invention;

FIG. 6 is a representative diagram of a program listing, a test command sequence generated according to a prior art method, and a test command sequence generated according to one embodiment of the invention.

DETAILED DESCRIPTION OF THE EMBODIMENTS

Figure 2:
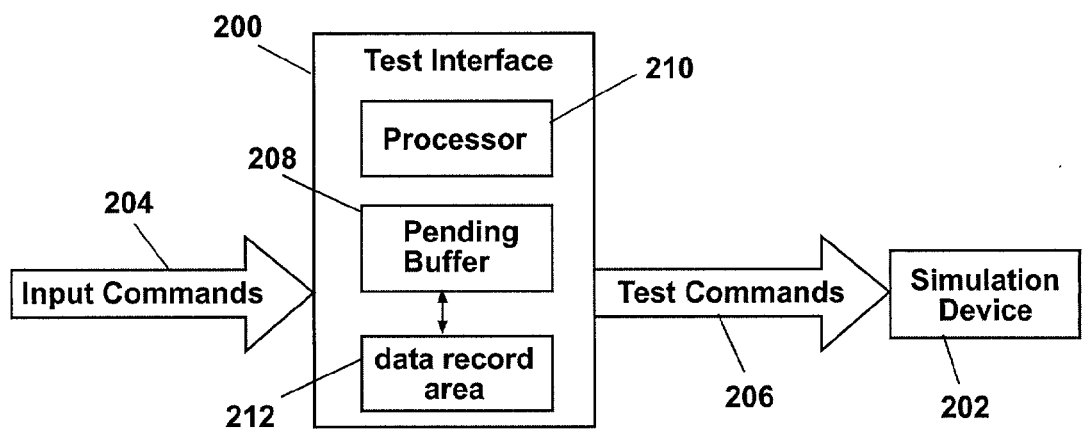
FIG. 2 is a representative block diagram illustrating a relationship between an embodiment of the invention and a simulation device.

FIG. 1 is a chart illustrating possible commands to be used in one embodiment of the inventive test interface. Possible commands include a write command 100 that writes data to a specified register inside the device being tested via any known manner. A clock command 102 writes a specified register to generate a string of clocks from the specified register. A read command 104 reads a specified register in the device, while a delay command 106 waits for a specified number of clocks. An assert command 108 reads a specified register to check whether it is a specified value. An output command 110 formats a comment for output by a generated file. A clock burst command 112 acts as a trigger for the test interface to burst its clock. As shown in FIG. 1, the write 100, clock 102, read 104, and assert 106 commands access the device, while the delay 108, output 110, and clock burst 112 commands do not.

FIG. 2 is a representative block diagram illustrating a relationship between a test interface 200 according to one embodiment of the invention and a device, such as a simulation device 202. In one embodiment, the simulation device 202 contains a virtual device to be tested and any interfaces necessary to translate test commands into a usable format. As shown in the Figure, test commands 204 written by a programmer are sent to the test interface 200. The test interface 200 translates the input commands 204 into test commands 206 and then transmits the test commands 206 into the simulation device 202. In one embodiment, the test interface 200 compiles and re-orders the input commands so that the test commands 206 ultimately sent to the simulation device minimize the number of test cycles needed to execute the sequence entered by the programmer. One embodiment of the inventive test interface 200 conducts this re-organization by storing a first command in a pending buffer 208 and checking the serial bit input data stream after receiving the first command to check whether the first command can be linked or combined with at least a portion of a second command to reduce the total number of test commands for a given sequence. The test interface itself 200 may be implemented as, for example, a processor 210 and storage areas acting as the pending buffer 208 and/or a data storage area 212.

Figure 3:
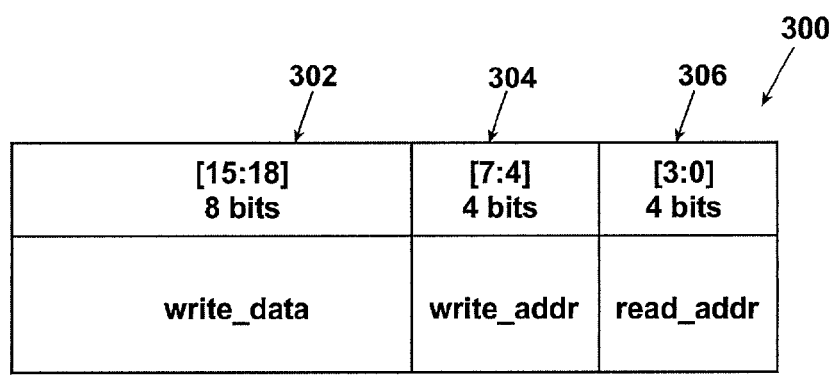
FIG. 3 is a representative diagram of a test command used in one embodiment of the invention.

Referring to FIG. 3, a test command 206 may have a command structure 300, which may include a write field 304 and a read field that contain information potentially eliciting a write to a specified address and a read to a specified address, respectively. In one embodiment, the command structure 300 is a 16-bit command, with 8 bits allocated as a data field 302 to hold data to be written to a given write address, 4 bits allocated to the write field 304 to hold the write address, and 4 bits allocated to the read field 306 to hold a read address where a read operation is to be performed when, for example, the write operation has been completed. Thus, in this example, 16 serial bits are transmitted for every operation; after the 16th clock, registers are updated inside the device, and after the 17th clock, a read register inside the device is loaded and prepared for scanning and output. Because the data is sent serially, the device 202 does not actually execute the command (e.g., release the device from reset) until it receives the entire serial bit stream associated with that command. For example, in the case of the write(release_from_reset) command, the actual release from reset will not occur until several clocks later (e.g., after 17 clocks). Further, even after the release from reset occurs, the status of the write(release_from_reset) command cannot be clocked out of the device 202 until the device 202 receives a read command. Another example of a possible command structure that could be used in conjunction with one embodiment of the inventive method is described in commonly assigned, co-pending U.S. patent application Ser. No. 10/109,258.

Note that certain input commands do not define all of the fields available in the command structure 300. For example, a write(release from reset) command defines a write address in the write field 304 and write data but does not define a read address. As a result, write commands will contain unused read fields 306. Other commands, such as delay and clock commands, may also contain unused read fields 306.

An embodiment of the inventive method takes advantage of these unused read fields 306 by incorporating a read or assert command into the unused read field 306 of a subsequent command having an unused read field 306. Generally, in one embodiment, the interface 200 has a pending buffer 208 that holds a command having an unused read field 306. The interface 200 then checks the serial bit stream to see whether the next command is a read command. If the next command is a read command, the interface combines that read command with the command in the pending buffer 208 and outputs the combined command to the device 202. If the next command is not a read command, however, both commands are sent to the device 202 in normal course, without combining any commands.

Figure 4:
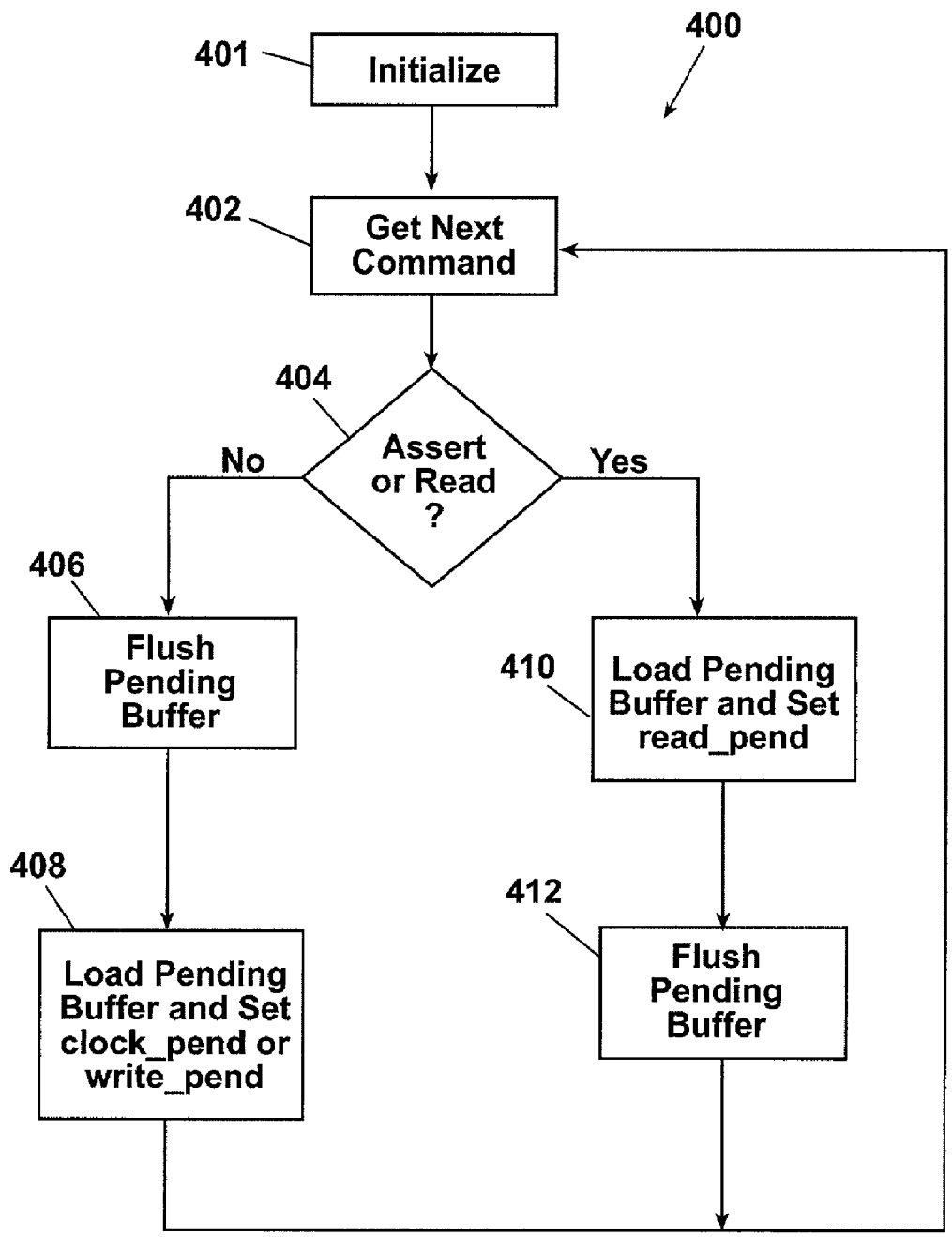
FIG. 4 is a flow diagram illustrating a test compiler operation according to one embodiment of the invention.

FIG. 4 is a flow diagram illustrating an overall process sequence 400 according to one embodiment of the invention. After an initialization step (block 401), the interface 200 obtains a command from a control program (block 402) and checks whether the command is an assert or read command (block 404). If the current incoming command is not an assert or read command, the interface 200 flushes the pending buffer 208 (block 406), sending any command or commands held in the buffer to the device, and then loads the pending buffer with the current incoming command (block 408). If the current incoming command is an assert or read command, however, the interface 200 loads the assert or read command into the pending buffer (block 410). After loading (block 410), the pending buffer 208 is then flushed (block 412), releasing the assert or read command to the device 202. Note that if the assert or read command can be combined with a previous command stored in the pending buffer, the loading and flushing steps 410, 412 include combining the previous command with the current assert or read command to form a combined command and sending the resulting combined command to the device as the test command.

For example, if the previous command, which is stored in the pending buffer 208, is a write command (thereby having an unused read field) and the current incoming command is a read command, the read command will be loaded into the pending buffer (block 410) and combined with the write command in the pending buffer 208. The pending buffer 208 is then flushed (block 412). The generated command combines a previously parsed command (e.g., a write, clock, or delay command) with the incoming assert or read command. The combined write and read command then travels as a single test command, eliminating the need for an additional test cycle to accommodate the assert or read command separately.

If the previous command in the pending buffer 208 is a write command and the current command is also a write command, however, the two commands cannot be combined. Thus, the interface 200 flushes the pending buffer (block 406) to send the write command in the pending buffer 208 to the device and loads the incoming current write command into the pending buffer (block 408). In essence, loading a command into the pending buffer 208 instead of outputting the command directly to the device 202 as soon as the command is received provides the interface 200 with the opportunity to combine the buffered command with the next incoming command (if the next incoming command happens to be an assert or read command) and send a single test command to the device 202. In one embodiment, the pending buffer 208 holds only one command; as a result, the arrival of a subsequent incoming command would push the pending command out of the pending buffer 208 to the device 202 to make room for the incoming command.

Figure 5:
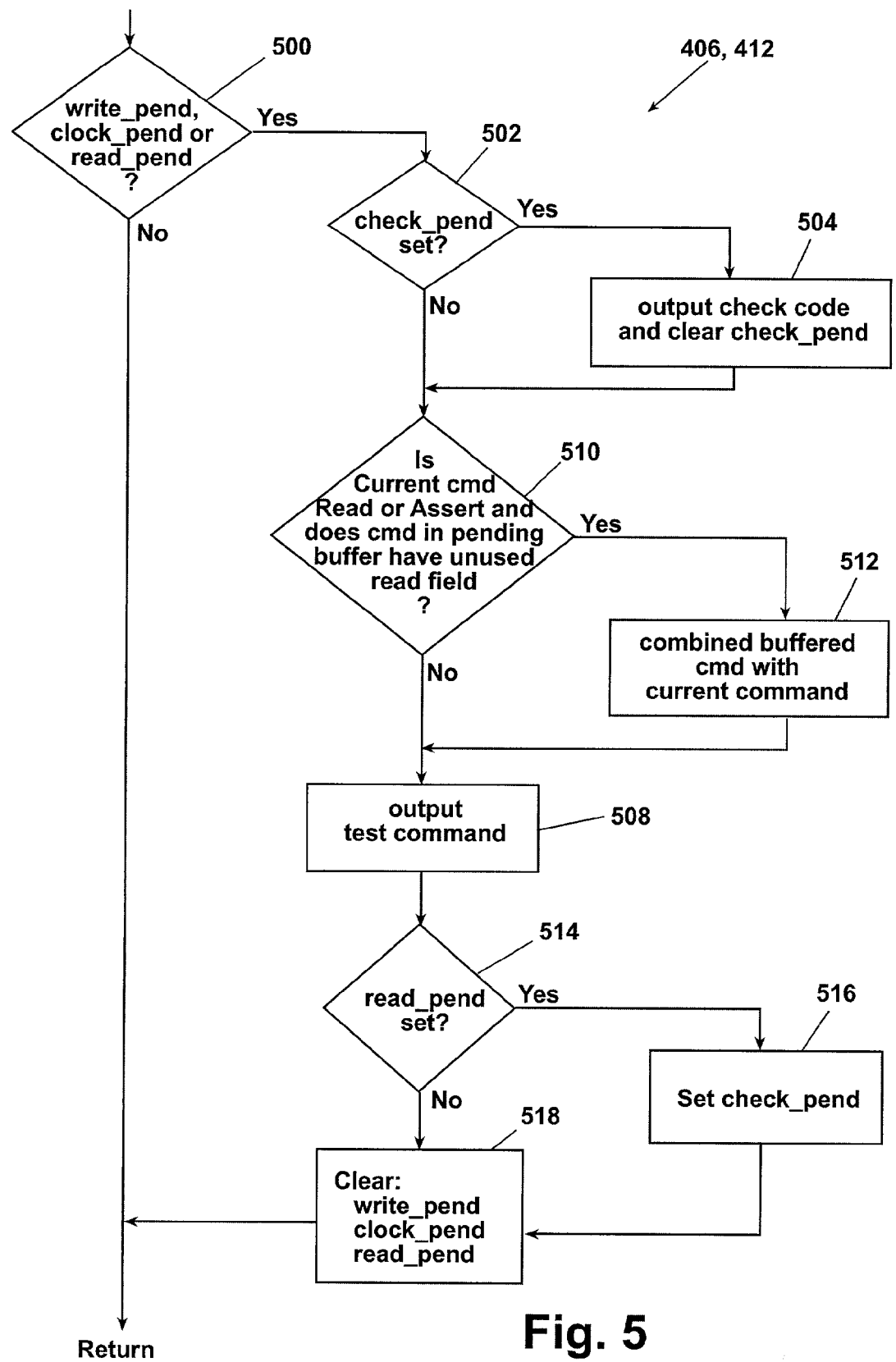
FIG. 5 is a flow diagram illustrating a flush pending buffer process according to one embodiment of the invention.

FIG. 5 is a flow diagram illustrating a buffer flushing process (blocks 406, 412) according to one embodiment of the invention. When an current command enters the interface 200, the interface 200 checks whether a "write pending" flag (write_pend), a "clock pending" flag (clock_pend), and/or a "read pending" flag (read_pend) is set by a previous command (block 500). These flags are set if there is a write, clock, or read command, respectively, in the pending buffer 208. If none of these commands are in the pending buffer (e.g., if the previous cycle output a combined command, thereby leaving the pending buffer 208 empty after the flushing step at block 412), the interface 200 returns to the next step in the process (e.g., blocks 402, 408), which depends on the nature of the current command.

If any of the above-listed flags are set, however, it indicates that a previous command has generated results that may need to be read out. The interface 200 checks a "check pending" flag (check_pend) at block 502 to determine whether results are available for reading. If the check_pend flag is set, it indicates that there was a read command on a previous cycle and that the results of that read are available for output. The results may be stored in, for example, a data record area 212 in the interface 200. The interface therefore outputs check code (block 504) to initiate a read output operation and reads out the command results from the data record area 212. Note that an assert command may also set the check_pend flag so that the results of the assert command may be read out in a later cycle to verify that the assert command executed properly and set the desired, expected value. After the results are read from the data record area 212, the interface clears the check_pend flag (block 506).

If the interface finds that the check_pend flag is not set at block 502, it means that the previous command did not generate any values that require checking to be initiated through the output check code. After the check_pend flag status is checked (block 502) and, if applicable, after the data record area 212 is read out (block 504), the interface 200 outputs a test command (block 508). Depending on the contents of the pending buffer 208, the test command output by the interface 200 may be a previously received command or a previously received command combined with an incoming assert or read command. In one embodiment, the interface 200 checks whether the command in the pending buffer 208 has an unused read field (e.g., a write command or a clock command) at block 510. If so, the interface 200 combines the previous command, which is stored in the pending buffer, with the current command (block 512) and outputs the combined command as a single test command (block 508). If combining the previous command in the pending buffer 306 with the current command is not possible (e.g., if they are both read commands), the interface 200 simply outputs the previous command in the pending buffer directly as the test command (block 508).

After outputting the test command (block 508), the interface 200 checks to see whether the read_pend flag is set (block 514). This would occur if the incoming command was a read or assert command (block 412). If the read_pend flag is set, the interface 200 sets the check_pend flag (block 516), alerting the interface 200 to check the data record area 503 for the results of the read or assert operation during the next cycle. The flushing process completes by clearing the write_pend, clock_pend, and read_pend flags (block 518), readying the flags for the next incoming command. The interface then returns to the main process illustrated in FIG. 4.

FIG. 6 illustrates one example of instructions that may be sent to the interface 200, a test command sequence that would be sent to a device being tested without combining any commands, and a test command sequence generated by one embodiment of the invention. In this example, the first three instructions are write(release_from_reset), assert_that(we_are_operating), and write(clock_100_times). A conventional test command sequence corresponding to these three instructions would contain three test commands, as shown in FIG. 6. More particularly, the test commands corresponding to the write instructions would contain write data and write address, but a null read address; for example, write(release_from_reset) would generate test_cmd (release_write_data, release_write_address, null_read_address) because the write command does not require a read operation. Similarly, assert_that(we_are_operating) would generate test_cmd(null_write_data, null_write_address, operating_read_address) because the assert command does not require a write operation. As can be seen in these two examples, each test command requires one test cycle even if they contain unused fields.

The invention reduces the total number of test cycles by incorporating the three commands described above into two, not three, test commands. Thus, as shown in FIG. 6, the first test command generated according to an embodiment of the invention incorporates the operating_read_address into the unused read field of the command corresponding with the write(release_from_reset) instruction. The resulting test command therefore can conduct the commands corresponding to write(release_from_reset) and the read operation corresponding to assert_that(we_are_operating) all in the same test cycle.

Further, because the results of any given read operation may not be available until after at least one test cycle has passed, the check_results(operate_flag_true?) test command is executed after the command corresponding to write(clock_100_times) and assert_that(init_is_finished) combined. In other words, the assert_that(we_are_operating) command will not be completed and available for verification until after the "clock 100 times" operation is done because, as noted above, the device 202 will not even execute the command until it receives the entire command. But by incorporating the operating read address into the unused read field of the "release from reset" write command, the assert operation can be initiated one test cycle sooner than in the conventional test command sequence, thereby allowing the results to also be obtained one cycle sooner.

The test command sequence generated by the invention therefore minimizes the number of null read and write fields in the test commands, reducing the overall number of test commands and thereby reducing the number of test cycles needed to test the device 202. Those of ordinary skill in the art will be able to identify other examples of combining commands together by studying FIG. 6 in the context of the above disclosure.

By using an interface to combine commands together, fewer test commands need to be sent to the device 202 for a given instruction sequence. Further, because the interface 200 reduces the total number of test commands by checking for commands that could be combined together, a user writing the instruction sequence can write the instruction sequence in a manner that keeps the process clear in the user's head without undesirably increasing the number of test commands sent to the device 202 due to the process clarity.

In short, combining an assert or read address corresponding to an assert or read command with a previous test command allows read operations to be executed without a separate read command and a separate test cycle. Further, because test commands normally require a read or assert command to read the results of the test command out of the device, placing the required read or assert command into an unused read field of an earlier command allows the test command results to be obtained without using an additional test cycle, which would ordinarily be required if the read or assert command were sent to the device as a separate command.

While the present invention has been particularly shown and described with reference to the foregoing preferred and alternative embodiments, it should be understood by those skilled in the art that various alternatives to the embodiments of the invention described herein may be employed in practicing the invention without departing from the spirit and scope of the invention as defined in the following claims. It is intended that the following claims define the scope of the invention and that the method and apparatus within the scope of these claims and their equivalents be covered thereby. This description of the invention should be understood to include all novel and non-obvious combinations of elements described herein, and claims may be presented in this or a later application to any novel and non-obvious combination of these elements. The foregoing embodiments are illustrative, and no single feature or element is essential to all possible combinations that may be claimed in this or a later application. Where the claims recite "a" or "a first" element of the equivalent thereof, such claims should be understood to include incorporation of one or more such elements, neither requiring nor excluding two or more such elements.

What is claimed is:

1. A device testing method, comprising:
   receiving a first command and a second command, the first command is one selected from the group consisting of a write command, a clock command, a read command, and an assert command;
   selectively combining at least a portion of the second command with at least a portion of the first command to generate a test command; and
   transmitting the test command to the device.

2. The method of claim 1, wherein the second command is one selected from the group consisting of a read command and an assert command.

3. A device testing method, comprising:
   receiving a first command and a second command;
   determining whether the second command is one of either an assert command or a read command;
   selectively combining at least a portion of the second command with at least a portion of the first command to generate a test command if the second command is one of either an assert command or a read command; and
   transmitting the test command to the device.

4. The method of claim 3, wherein if the second command is one of either an assert command or a read command, the method further comprising:
   loading the first command into a pending buffer;
   combining the second command with the first command; and
   flushing the pending buffer.

5. The method of claim 4, wherein the combining act is part of the flushing act.

6. A device testing method, comprising:
   receiving a first command and a second command;
   determining whether the second command is one of either an assert command or a read command;
   selectively combining at least a portion of the second command with at least a portion of the first command to generate a test command; and
   transmitting at least one of the first command and the second command to the device if the second command is not one of either an assert command or a read command.

7. A device testing method, comprising:
   receiving a previous command and a current command, the previous command having an unused field;
   determining whether the current command is of a predetermined type;
   combining at least a portion of the current command with the unused field of the previous command if the current command is of the predetermined type to form a combined command; and
   transmitting the combined command as a test command to the device.

8. The method of claim 7, further comprising:
   transmitting the previous command as the test command if the current command is not of the predetermined type.

9. The method of claim 7, wherein the predetermined type is at least one selected from the group consisting of an assert command and a read command.

10. The method of claim 7, wherein the unused field is an unused read field, and wherein the current command has a read address that is incorporated into the unused read field during the combining act.

11. The method of claim 7, wherein the previous command is stored in a pending buffer, and wherein the method further comprises replacing the previous command in the pending buffer with the current command if the current command is not of the predetermined type.

12. The method of claim 7, wherein the previous command is stored in a pending buffer, and wherein the method further comprises:
    flushing the pending buffer and then loading the pending buffer with the current command if the current command is not of the predetermined type;
    loading the pending buffer with the current command and flushing the pending buffer if the current command is of the predetermined type.

13. The method of claim 12, wherein the flushing act comprises:
    determining whether the current command is of the predetermined type and determining whether the previous command has an unused field; and
    incorporating the current command into the unused field of the previous command in the combining act.

14. The method of claim 13, wherein the predetermined type is at least one selected from the group consisting of an assert command and a read command, and wherein the flushing act further, comprises:
    checking a check pending flag to detect whether data needs to be read out from a data record area;
    checking whether a read pending flag is set, indicating that the current command is of the predetermined type; and
    setting the check pending flag if the current command is of the predetermined type.

15. A device testing interface, comprising:
    a pending buffer;
    a data record area; and
    a processor that receives a plurality of input commands, including a previous command and a current command,
    wherein the processor stores a previous command in the pending buffer, detects whether the previous command has an unused field, determines whether the current command is of a predetermined type, combines at least a portion of the current command with into the unused field of the previous command if the current command is of the predetermined type to form a combined command, and transmits the combined command as a test command to the device.

16. The device testing interface of claim 15, wherein the unused field is an unused read field, and wherein the current command has a read address that the processor incorporates into the unused read field to form the combined command.

17. A device testing method, comprising:
    receiving a first command and a second command, the first command having an unused read field, the second command having a read address;
    selectively combining the read address of the second command with the unused read field of the first command to generate a test command; and
    transmitting the test command to the device."

* * * * *